(12) United States Patent
Lankes et al.

(10) Patent No.: US 12,341,318 B2
(45) Date of Patent: Jun. 24, 2025

(54) OPTOELECTRONIC COMPONENT

(71) Applicant: OSRAM OPTO SEMICONDUCTORS GMBH, Regensburg (DE)

(72) Inventors: Simon Lankes, Regensburg (DE); Dennis Sprenger, Röthenbach (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 538 days.

(21) Appl. No.: 17/634,741

(22) PCT Filed: Aug. 7, 2020

(86) PCT No.: PCT/EP2020/072292
§ 371 (c)(1),
(2) Date: Feb. 11, 2022

(87) PCT Pub. No.: WO2021/028352
PCT Pub. Date: Feb. 18, 2021

(65) Prior Publication Data
US 2022/0285912 A1    Sep. 8, 2022

(30) Foreign Application Priority Data
Aug. 14, 2019   (DE) .................... 10 2019 121 896.9

(51) Int. Cl.
*H01S 5/06*       (2006.01)
*F21S 41/16*      (2018.01)
(Continued)

(52) U.S. Cl.
CPC .......... *H01S 5/0611* (2013.01); *H01S 5/0087* (2021.01); *H01S 5/02255* (2021.01);
(Continued)

(58) Field of Classification Search
CPC .... H01S 5/0611; H01S 5/0087; H01S 5/0092; H01S 5/02255; H01S 5/0071;
(Continued)

(56) References Cited

U.S. PATENT DOCUMENTS

2006/0139926 A1* 6/2006 Morioka ........... G02F 1/133603
                                                         362/260
2006/0291246 A1* 12/2006 Hattori ................ H01S 5/02255
                                                         257/E33.072
(Continued)

FOREIGN PATENT DOCUMENTS

CN        207250931 U      4/2018
CN        108139066 A  *   6/2018    .............. F21S 41/14
(Continued)

OTHER PUBLICATIONS

Saynova, Desislava (EP Examiner), International Search Report (with English Translation) and Written Opinion in corresponding International Application No. PCT/EP2020/072292 mailed on Nov. 25, 2020, 12 pages.
(Continued)

*Primary Examiner* — Joshua King
(74) *Attorney, Agent, or Firm* — MH2 Technology Law Group LLP (57) ABSTRACT

The invention relates to an optoelectronic component, comprising at least one semiconductor emitter having an active region designed for emitting electromagnetic radiation of a first wavelength range. The optoelectronic component also comprises at least one wavelength conversion plate, having a decoupling surface and a lateral surface arranged laterally to same and orientated transverse to same, as well as a substrate on which the semiconductor emitter and the wavelength conversion plate are arranged. The decoupling surface is facing away from the substrate. The semiconductor emitter is designed to irradiate the wavelength conversion
(Continued)

plate with electromagnetic radiation on the lateral surface. The wavelength conversion plate is designed to emit a mixed radiation out of the decoupling surface, said mixed radiation comprising at least one portion of the radiation of the first wavelength range and a converted radiation of a second wavelength range.

17 Claims, 5 Drawing Sheets

(51) Int. Cl.
*F21S 41/176* (2018.01)
*H01S 5/00* (2006.01)
*H01S 5/02255* (2021.01)
*H01S 5/40* (2006.01)

(52) U.S. Cl.
CPC .............. *F21S 41/16* (2018.01); *F21S 41/176* (2018.01); *H01S 5/4056* (2013.01)

(58) Field of Classification Search
CPC ....... F21S 41/16; F21S 41/176; H01L 33/483; H01L 33/505; H01L 2933/0091; H01L 33/46; H01L 33/44; F21K 9/64
See application file for complete search history.

(56) References Cited

U.S. PATENT DOCUMENTS

| | | | |
|---|---|---|---|
| 2008/0169752 A1* | 7/2008 | Hattori | H01L 33/507 313/503 |
| 2009/0321771 A1* | 12/2009 | Hattori | H01S 5/02255 257/98 |
| 2010/0246159 A1* | 9/2010 | Wada | F21K 9/00 257/E21.599 |
| 2010/0295438 A1* | 11/2010 | Ott | F21V 13/14 313/46 |
| 2011/0025190 A1 | 2/2011 | Jagt | |
| 2013/0343079 A1* | 12/2013 | Unger | F21V 13/04 362/555 |
| 2016/0327244 A1* | 11/2016 | Annen | F21K 9/61 |
| 2017/0051883 A1* | 2/2017 | Raring | H01S 5/2201 |
| 2017/0051884 A1* | 2/2017 | Raring | H01S 5/22 |
| 2017/0241619 A1 | 8/2017 | Fidler et al. | |
| 2017/0256685 A1* | 9/2017 | Schug | H01S 5/0239 |
| 2018/0087726 A1* | 3/2018 | Yamashita | H01S 5/02255 |
| 2018/0122993 A1* | 5/2018 | Camras | H01L 33/005 |
| 2018/0149591 A1* | 5/2018 | Yamashita | H01S 5/02212 |
| 2018/0306410 A1 | 10/2018 | Abe et al. | |
| 2018/0316160 A1* | 11/2018 | Raring | H01S 5/0233 |
| 2018/0375001 A1* | 12/2018 | Ueno | H01S 5/0683 |
| 2019/0013642 A1* | 1/2019 | Stojetz | H01S 5/4087 |
| 2019/0097095 A1* | 3/2019 | Yamanaka | F21V 9/38 |
| 2019/0170314 A1* | 6/2019 | Lenef | F21S 43/26 |
| 2019/0285248 A1* | 9/2019 | Kamiya | F21V 7/0008 |
| 2020/0200347 A1 | 6/2020 | Uwani et al. | |

FOREIGN PATENT DOCUMENTS

| | | | | |
|---|---|---|---|---|
| CN | 108292823 A | * | 7/2018 | ............... F21V 9/32 |
| CN | 110291224 A | * | 9/2019 | ............. C09K 11/02 |
| DE | 102011050450 A1 | | 11/2012 | |
| DE | 202014001375 U1 | | 2/2014 | |
| DE | 102016224811 A1 | | 6/2018 | |
| DE | 102017104134 A1 | * | 8/2018 | ........... C03C 14/004 |
| EP | 3399604 A1 | | 11/2018 | |
| JP | 2006210887 A | | 8/2006 | |
| JP | 2010251686 A | | 11/2010 | |
| JP | 2011515846 A | | 5/2011 | |
| JP | 2011181794 A | * | 9/2011 | ........... G02B 6/0023 |
| JP | 2012009380 A | | 1/2012 | |
| JP | 2012054272 A | * | 3/2012 | |
| JP | 2014082057 A | | 5/2014 | |
| JP | 2017120864 A | | 7/2017 | |
| JP | 2018126035 A | | 8/2018 | |
| JP | 2020004927 A | | 1/2020 | |
| JP | 3241220 U | * | 3/2023 | ................ F21V 7/30 |
| WO | WO-2013139675 A1 | * | 9/2013 | ................ B60Q 1/00 |
| WO | WO-2014013923 A1 | * | 1/2014 | ........... G03B 21/204 |
| WO | WO-2014119783 A1 | * | 8/2014 | ................ F21K 9/64 |
| WO | WO-2017064283 A1 | * | 4/2017 | ............. H01L 33/483 |
| WO | WO-2017154807 A1 | * | 9/2017 | ................ F21K 9/64 |
| WO | WO-2017157844 A1 | * | 9/2017 | ................ F21K 9/20 |
| WO | WO-2019053053 A1 | * | 3/2019 | ........... H01S 5/0087 |
| WO | WO-2020008943 A1 | * | 1/2020 | |

OTHER PUBLICATIONS

Japanese Notification of Reasons for Refusal issued in Japanese Patent Application No. 2022-508929 dated Feb. 17, 2023, 10 pages, with English translation.

* cited by examiner

OPTOELECTRONIC COMPONENT

CROSS-REFERENCE TO RELATED APPLICATIONS

This patent application is a national stage entry from International Application No. PCT/EP2020/072292, filed on Aug. 7, 2020, published as International Publication No. WO 2021/028352 A1 on Feb. 18, 2021, and claims priority under 35 U.S.C. § 119 from German patent application 10 2019 121 986.9, filed Aug. 14, 2019, the entire contents of all of which are incorporated by reference herein.

FIELD OF THE INVENTION

An optoelectronic component is specified. An optoelectronic component is configured in particular for generating electromagnetic radiation, in particular light perceptible to the human eye.

BACKGROUND OF THE INVENTION

A task to be solved is to specify an optoelectronic component that comprises a particularly high luminance.

SUMMARY OF THE INVENTION

According to at least one embodiment, the optoelectronic component comprises at least one semiconductor emitter which comprises an active region arranged to emit electromagnetic radiation of a first wavelength range. The active region preferably comprises a pn junction, a double heterostructure, a single quantum well (SQW) structure, or a multiple quantum well (MQW) structure for radiation generation. The semiconductor emitters are, for example, light emitting diodes or laser diodes. The first wavelength range preferably comprises at least a portion of the region of the electromagnetic radiation spectrum visible to humans.

According to at least one embodiment, the optoelectronic component or its embodiment described above comprises at least one wavelength conversion plate comprising an outcoupling surface and a side surface arranged laterally with respect thereto and oriented transversely thereto. In particular, the side surface is divided into a plurality of sections.

In particular, the wavelength conversion plate is configured to convert electromagnetic radiation of the first wavelength range to electromagnetic radiation of a second wavelength range, wherein the second wavelength range is different from the first wavelength range. For example, the wavelength conversion plate comprises a ceramic matrix material into which particles of a conversion material are introduced. In particular, the wavelength conversion plate is formed with at least one of the following materials: YAG, LuAG, silicon nitride, or quantum dots, each with corresponding doping atoms. Doping atoms are, for example, Ce, Gd, Ga.

The outcoupling surface of the wavelength conversion plate is preferably oriented parallel to the main extension plane of the wavelength conversion plate. In particular, the outcoupling surface is configured to couple electromagnetic radiation out from the wavelength conversion plate. The side surface oriented laterally and transversely to the outcoupling surface limits the wavelength conversion plate, in particular in its main extension direction. The side surface is preferably configured for coupling electromagnetic radiation into the wavelength conversion plate.

According to at least one embodiment, the optoelectronic component or one of its embodiments described above comprises a carrier on which the semiconductor emitter and the wavelength conversion plate are arranged. In particular, the semiconductor emitter and the wavelength conversion plate are arranged in a common plane on the carrier. For example, the semiconductor emitter is arranged on a surface of the carrier that is inclined with respect to the wavelength conversion plate. For example, the carrier serves as a mounting surface for the subsequent devices. Preferably, the carrier is a mechanically supporting component of the optoelectronic component that provides sufficient stability to the component. For example, the carrier is implemented as a substantially planar plate. Preferably, the carrier comprises a high thermal conductivity to serve to dissipate heat from the components mounted on the carrier.

For example, the semiconductor emitter and the wavelength conversion plate comprise a form-fit connection to the carrier. In particular, this improves heat exchange between the carrier, the semiconductor emitter, and the wavelength conversion plate. A direct arrangement of the semiconductor emitter and the wavelength conversion plate on the carrier advantageously enables particularly good heat dissipation of the semiconductor emitter and the wavelength conversion plate.

According to at least one embodiment of the optoelectronic component or one of its embodiments described above, the outcoupling surface faces away from the carrier. The outcoupling surface of the wavelength conversion plate refers to the side of the wavelength conversion plate that is on the side facing away from the carrier. In particular, the outcoupling surface serves to couple electromagnetic radiation out from the wavelength conversion plate.

According to at least one embodiment of the optoelectronic component or one of its embodiments described above, the semiconductor emitter is configured to irradiate the wavelength conversion plate at the side surface with electromagnetic radiation. In other words, the semiconductor emitter is arranged on the carrier such that it irradiates the side surface of the wavelength conversion plate with electromagnetic radiation. In particular, this eliminates the need for an optical element between the semiconductor emitter and the wavelength conversion plate.

According to at least one embodiment of the optoelectronic component or one of its embodiments described above, the wavelength conversion plate is configured to emit mixed radiation comprising at least a portion of radiation of the first wavelength range and converted radiation of a second wavelength range from the outcoupling surface. For example, the mixed radiation produces a white color impression to an observer.

According to at least one embodiment, the optoelectronic component or one of its embodiments described above comprises,
  at least one semiconductor emitter comprising an active region arranged to emit electromagnetic radiation of a first wavelength range,
  at least one wavelength conversion plate comprising an outcoupling surface and a side surface arranged laterally thereto and aligned transversely thereto, and
  a carrier on which the semiconductor emitter and the wavelength conversion plate are arranged, wherein
  the outcoupling surface faces away from the carrier,
  the semiconductor emitter is configured to irradiate the wavelength conversion plate at the side surface with electromagnetic radiation, and the wavelength conversion plate is configured to emit mixed radiation comprising at least a portion of radiation of the first wavelength range and converted radiation of a second wavelength range from the outcoupling surface.

An optoelectronic component described herein is based inter alia on the following considerations: the use of optoelectronic components, for example in automobile headlights, requires the integration of optoelectronic components in an increasingly smaller installation space, due to additional sensors, in particular cameras, which are also to be accommodated in the headlight, or the front area of the automobile. As the optoelectronic components thus become smaller, components with higher luminance levels become advantageous, while the requirements for the amount of light generated by the components remain the same. Sufficiently high luminance levels are provided, for example, by laser diodes, which are used, for example, with the aid of a wavelength conversion plate to emit electromagnetic radiation with a white color impression. However, the lower expansion of optoelectronic components means increased heat generation of the components. Furthermore, the use of laser diodes requires an increased effort to avoid direct impingement of electromagnetic radiation from the laser diode at an observer.

The optoelectronic component described herein and embodiments thereof make use, inter alia, of the idea of mounting a semiconductor emitter and a wavelength conversion plate on a carrier in a common plane. Direct mounting of the semiconductor emitter and the wavelength conversion plate allows for particularly good heat dissipation of the semiconductor emitter and the wavelength conversion plate. The coupling of electromagnetic radiation into the wavelength conversion plate takes place, for example, laterally and thus parallel to the main direction of extension of the carrier. The risk of direct coupling out of electromagnetic radiation from the semiconductor emitter is thus advantageously reduced.

According to at least one embodiment of the optoelectronic component or one of its embodiments described above, the semiconductor emitter is a laser diode. A laser diode comprises in particular a high luminance and a particularly high degree of polarization. Furthermore, a laser diode is preferably configured to emit coherent radiation. Coherent radiation is essentially monochromatic and comprises a very narrow spectral wavelength range.

According to at least one embodiment of the optoelectronic component or one of its embodiments described above, the semiconductor emitter comprises an emission cone whose cross-section perpendicular to an axis of the emission cone comprises an elliptical shape. The semiconductor emitter is arranged on the carrier such that the longer ellipse axis is aligned parallel to the major direction of extension of the side surface of the wavelength conversion plate. The parallel alignment does not necessarily have to be exactly parallel, but rather exhibits a slight deviation from the parallel alignment, for example, within the scope of a manufacturing tolerance. Thus, direct irradiation of the side surface with the electromagnetic radiation of the first wavelength range is possible. Optical components for reshaping the emission cone are advantageously dispensed with.

According to at least one embodiment of the optoelectronic component or one of its embodiments described above, the side surface is oriented at a Brewster angle to the axis of the emission cone. The irradiation of light emitted from the semiconductor emitter onto the side surface of the wavelength conversion plate thus occurs particularly at the Brewster angle, advantageously reducing back reflection of the radiation. The coupling efficiency of the electromagnetic radiation is thus advantageously increased. The coupling efficiency is determined inter alia by the degree of polarization of the electromagnetic radiation and the orientation of the polarization plane. Advantageously, a high degree of polarization causes an increased coupling efficiency.

In particular, the side surface is inclined in the direction of the carrier to prevent the unhindered coupling out of any remaining portion of a reflection of the radiation emitted from the semiconductor emitter. Thus, direct emission of radiation from the semiconductor emitter is advantageously avoided, thereby increasing eye safety.

According to at least one embodiment of the optoelectronic component or one of its embodiments described above, an optical coating is applied to the side surface. The optical coating is, for example, an anti-reflective coating or a dichroic coating. The optical coating contributes to an increase in coupling efficiency, for example, without a dependence on a particular angle of incidence. In other words, the use of an anti-reflective coating or a dichroic coating can increase the coupling efficiency even without a Brewster angle orientation of the side surface. For example, this enables a simplified method for producing the side surface, since there is no need to maintain a defined angle of the side surface with respect to the emission cone.

According to at least one embodiment of the optoelectronic component or one of its embodiments described above, a light guide is arranged between the semiconductor emitter and the wavelength conversion plate to guide radiation from the semiconductor emitter to the wavelength conversion plate. For example, the semiconductor emitter is thus mounted independently of the geometry of the emission cone and its distance from the wavelength conversion plate. The light guide is preferably formed with a material that is permeable to radiation. The refractive index of the material of the light guide is higher than the refractive index of the material surrounding it. This allows, for example, guiding electromagnetic radiation in the light guide by means of total internal reflection.

According to at least one embodiment of the optoelectronic component or one of its embodiments described above, at least two semiconductor emitters are provided for irradiating the side surface of the wavelength conversion plate. By means of two semiconductor emitters on opposite sides of the wavelength conversion plate, for example, a particularly uniform illumination of the wavelength conversion plate is achieved.

According to at least one embodiment of the optoelectronic component or one of its embodiments described above, the emission cones of at least two semiconductor emitters at least partially overlap. The emission cones of the semiconductor emitters overlap at least partially in regions of the side surface where a particularly high intensity of electromagnetic radiation is advantageous.

According to at least one embodiment of the optoelectronic component or one of its embodiments described above, the wavelength conversion plate comprises at least one absorbing or reflecting sub region for selectively influencing the radiation behavior of the wavelength conversion plate. An absorbing or reflecting sub region serves, for example, to shape the radiation distribution emitted by the outcoupling surface. In a car headlight, for example, a desired radiation distribution corresponding to a desired illumination of the road is made possible. For example, the projection of a company logo is thus also possible. The sub region is preferably arranged as a coating on a side of the wavelength conversion plate facing away from the carrier. Alternatively, the sub region is embedded in the wavelength conversion plate.

According to at least one embodiment of the optoelectronic component or one of its embodiments described above, the wavelength conversion plate comprises conversion particles and scattering particles. Conversion particles are particularly adapted to convert electromagnetic radiation of a first wavelength to electromagnetic radiation of a second wavelength. Scattering particles are particularly configured to spatially distribute electromagnetic radiation.

According to at least one embodiment of the optoelectronic component or one of its embodiments described above, a desired intensity distribution of the mixed radiation over the outcoupling surface of the wavelength conversion plate is adjusted by means of a variation of a scattering effect in the wavelength conversion plate. The scattering effect is adjusted, for example, by means of a variation in the density, size and/or type of scattering centers. In particular, pores filled with a gas, the scattering particles and/or the conversion particles serve as scattering centers. For example, this compensates for a drop in intensity of the incident electromagnetic radiation of the first wavelength range from the outside to the inside. In particular, a desired radiation distribution of the mixed radiation coupled out from the wavelength conversion plate via the outcoupling surface is thus set in a targeted manner. For example, the scattering effect varies by at least 5%, preferably by at least 10% of its mean value.

According to at least one embodiment of the optoelectronic component or one of its embodiments described above, a desired intensity and/or color distribution of the mixed radiation over the outcoupling surface of the wavelength conversion plate is adjusted by means of a variation of a conversion effect in the wavelength conversion plate. For example, a desired radiation distribution of the radiation coupled out from the wavelength conversion plate via the outcoupling surface is thus specifically set. The conversion effect can be adjusted, for example, by means of different dopants in the converter particles, a variation in the density of the converter particles, the size of the converter particles or the converter material used.

According to at least one embodiment of the optoelectronic component or one of its embodiments described above, the wavelength conversion plate comprises a thickness of 3 μm inclusive to 500 μm inclusive, preferably from 70 μm inclusive to 150 μm inclusive. Advantageously, a particularly thin wavelength conversion plate enables a particularly good heat dissipation of the wavelength conversion plate.

According to at least one embodiment of the optoelectronic component or one of its embodiments described above, the first wavelength range of the semiconductor emitter comprises a region from 380 nm inclusive to 500 nm inclusive, preferably a region from 440 nm inclusive to 460 nm inclusive. Within this wavelength range, wavelength conversion to, for example, yellow light is particularly easy. Thus, for example, a mixed light is generated which produces a white color impression in an observer.

According to at least one embodiment of the optoelectronic component or one of its embodiments described above, the carrier is formed with one of the following materials: Aluminum nitride, a metal, and/or a silicon carbide. Aluminum nitride, metals and silicon carbide comprise a particularly high thermal conductivity. In particular, the metal comprises Au, Ag and/or Cu or an alloy of said metals. A high thermal conductivity advantageously contributes to a particularly efficient heat dissipation of the components arranged on the carrier.

According to at least one embodiment of the optoelectronic component or one of its embodiments described above, a reflection-increasing coating for radiation to be emitted by the wavelength conversion plate is arranged between the carrier and the wavelength conversion plate. The radiation to be emitted from the wavelength conversion plate includes the electromagnetic radiation of the first wavelength range and the converted radiation. Advantageously, radiation emitted from the wavelength conversion plate is thus preferably coupled out in the direction of the outcoupling surface. For example, the coating is applied only in some regions.

For example, the coating is first applied to the wavelength conversion plate. In particular, the wavelength conversion plate provides a smooth and flat surface, which allows a particularly simple arrangement of the coating. Alternatively, the coating is applied to the carrier before the wavelength conversion plate is mounted on the carrier. Advantageously, this facilitates the arrangement of a very thin, for example sprayed-on, coating.

An optoelectronic component described herein and embodiments thereof are particularly suitable for use as a headlight in an automobile.

Further advantages and advantageous embodiments and further embodiments of the optoelectronic component result from the following exemplary embodiments shown in connection with the figures.

DETAILED DESCRIPTION

Elements that are identical, similar or have the same effect are marked with the same reference signs in the figures. The figures and the proportions of the elements shown in the figures with respect to one another are not to be regarded as to scale. Rather, individual elements may be shown exaggeratedly large for better representability and/or for better comprehensibility.

Figure 1:
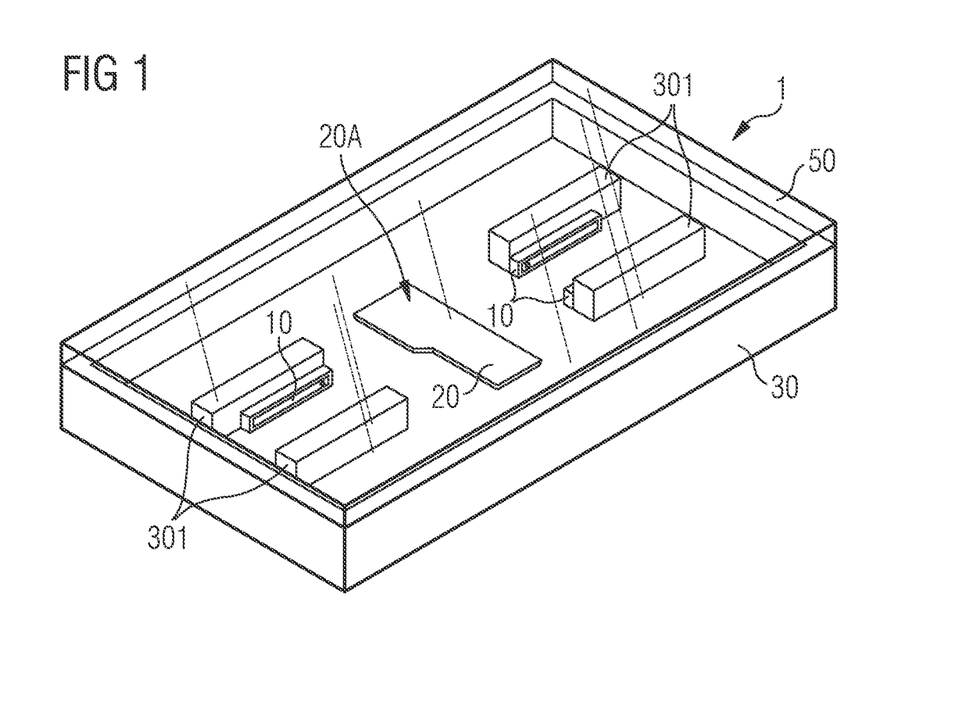
FIG. 1 a schematic view of an optoelectronic component described herein according to a first exemplary embodiment, FIG. 2 a section of a schematic view of the optoelectronic component described herein according to the first exemplary embodiment, FIG. 3 a schematic view of an optoelectronic component described herein according to a second exemplary embodiment, FIG. 4 a schematic sectional view of an optoelectronic component described herein according to a third exemplary embodiment, FIG. 5 a schematic sectional view of an optoelectronic component described herein according to the first exemplary embodiment, FIG. 6 a schematic top view of a wavelength conversion plate described herein according to an exemplary embodiment, FIG. 7 a schematic sectional view of an optoelectronic component described herein according to a fourth exemplary embodiment, and FIG. 8 a schematic sectional view of an optoelectronic component described herein according to a fifth exemplary embodiment.

FIG. 1 shows a schematic view of an optoelectronic component 1 described herein according to a first exemplary embodiment. The optoelectronic component 1 shown comprises four semiconductor emitters 10 and a wavelength conversion plate 20 arranged together with the semiconductor emitters on a carrier 30.

The semiconductor emitters 10 are configured as laser diodes and are configured to emit coherent electromagnetic radiation. Furthermore, the semiconductor emitters 10 each comprise elliptical emission cones with a longer elliptical axis and a shorter elliptical axis. The longer elliptical axis is caused in particular by a large radiation angle, while the shorter elliptical axis causes a small radiation angle.

The semiconductor emitters 10 are mounted on opposite sides of the wavelength conversion plate 20 to ensure particularly uniform irradiation of the side surfaces 20B. The emission cone of the semiconductor emitters 10 corresponds to an ellipse in a cross-section transverse to the axis of the emission cone. The semiconductor emitters 10 are arranged on the carrier 30 such that the longer axis of the ellipse is aligned parallel to the main extension direction of the wavelength conversion plate 20 within a manufacturing tolerance. The semiconductor emitters 10 are mounted by means of an auxiliary carrier 301 to ensure sufficient mechanical stability of the mounted semiconductor emitters 10.

Furthermore, the auxiliary carrier enables an arrangement of the semiconductor emitters 10 rotated by 90° along the main axis of the emission cone. The longer ellipse axis of the semiconductor emitters 10 is preferably aligned parallel to the main extension plane of the wavelength conversion plate 20. Advantageously, this allows easy illumination of the side surface 20B by utilizing the Brewster angle. The auxiliary carrier 301 is formed with aluminum nitride or silicon carbide, and additionally improves a heat dissipation of the semiconductor emitters 10. The direct arrangement of the semiconductor emitters 10 on the carrier 30 advantageously enables a particularly good heat dissipation and also serves a uniform alignment of the semiconductor emitters 10 and the wavelength conversion plate 20 in a common plane.

The wavelength conversion plate 20 is formed with any of the following materials: YAG, LuAG, silicon nitride, or quantum dots, each with corresponding doping atoms. Doping atoms are, for example, Ce, Gd, Ga. The wavelength conversion plate 20 includes an outcoupling surface 20A through which electromagnetic radiation is coupled out. The outcoupling surface 20A comprises an edge length of 300 μm on its shorter side and an edge length of 1 mm on its longer side. The wavelength conversion plate 20 comprises a purposefully shaped outcoupling surface 20A to achieve a desired radiation pattern.

For example, a shadow edge desired for a low beam of an automobile is produced in this way. Transverse to the outcoupling surface 20A is a side surface 20B arranged around the wavelength conversion plate 20. The thickness of the wavelength conversion plate 20 is equal to the height of the side surface 20B and is between 70 μm and 100 μm, respectively, inclusive. Electromagnetic radiation from the semiconductor emitters 10 is coupled to the side surface 20B of the wavelength conversion plate 20.

The carrier 30 is formed with aluminum nitride and comprises a particularly high thermal conductivity. To protect the semiconductor emitter 10 and the wavelength conversion plate 20 from external environmental influences, a protective layer 50 is provided on the upper side of the carrier 30. The protective layer 50 is designed to be transparent to radiation and is formed, for example, with a glass or sapphire.

Figure 2:
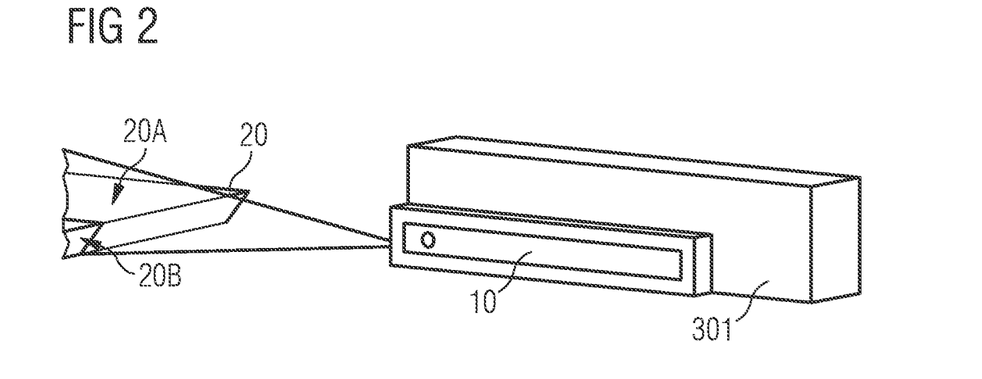

FIG. 2 shows a section of a schematic view of the optoelectronic component described herein according to the first exemplary embodiment. The section view includes a semiconductor emitter 10, an auxiliary carrier 301, and the wavelength conversion plate 20, wherein the coupling of electromagnetic radiation from the semiconductor emitter 10 into the side surface 20B of the wavelength conversion plate is clearly visible.

The side surface 20B comprises a chamfer facing the carrier 30. The chamfer is at an angle that ensures that the electromagnetic radiation from the semiconductor emitter 10 impinges on the side surface 20B of the wavelength conversion plate 20 at a Brewster angle. This ensures particularly efficient coupling of the electromagnetic radiation into the wavelength conversion plate 20.

Figure 3:
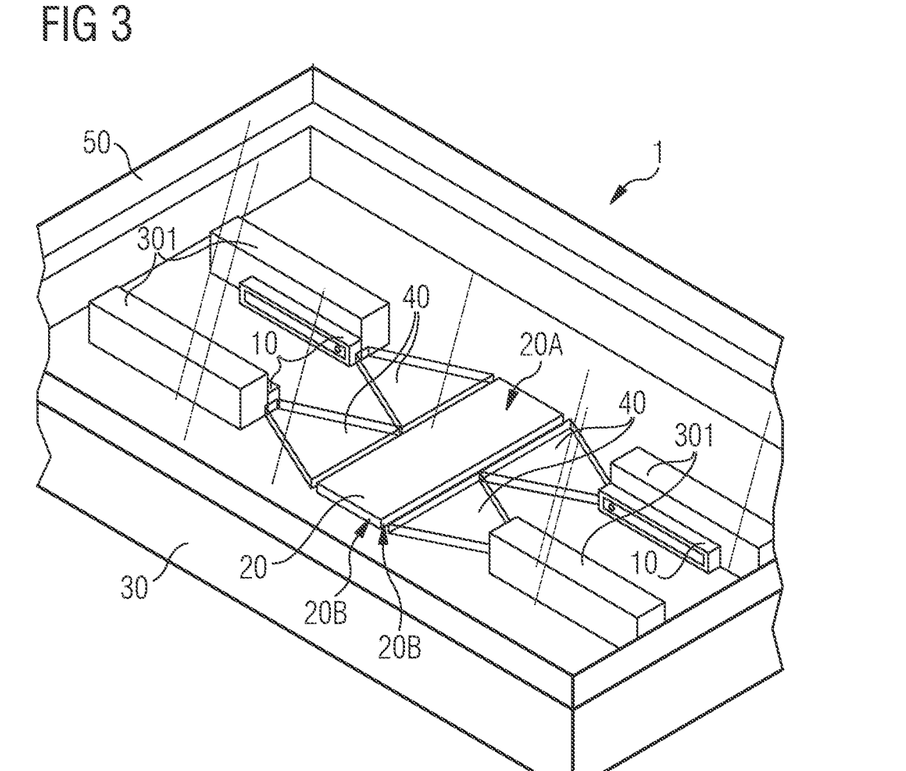

FIG. 3 shows a schematic view of an optoelectronic component 1 described herein according to a second exemplary embodiment. The optoelectronic component 1 comprises four semiconductor emitters 10 arranged on a carrier 30 together with a wavelength conversion plate 20, four light guides 40 and four auxiliary carriers 301. For protection against external environmental influences, there is a protective layer 50 above the carrier 30 which is designed to be permeable to the emitted light.

The light guides 40 are arranged on the carrier 30 between the semiconductor emitters 10 and the wavelength conversion plate 20, respectively. The light guides 40 serve to guide an electromagnetic radiation emitted from the semiconductor emitter 10 toward the wavelength conversion plate 20. The refractive index of the light guides 40 is higher than the refractive index of the material surrounding them. For example, the semiconductor emitters 10 are thus mounted without taking into account the aperture angle of the emission cones of the electromagnetic radiation emitted from the semiconductor emitters 10.

Figure 4:
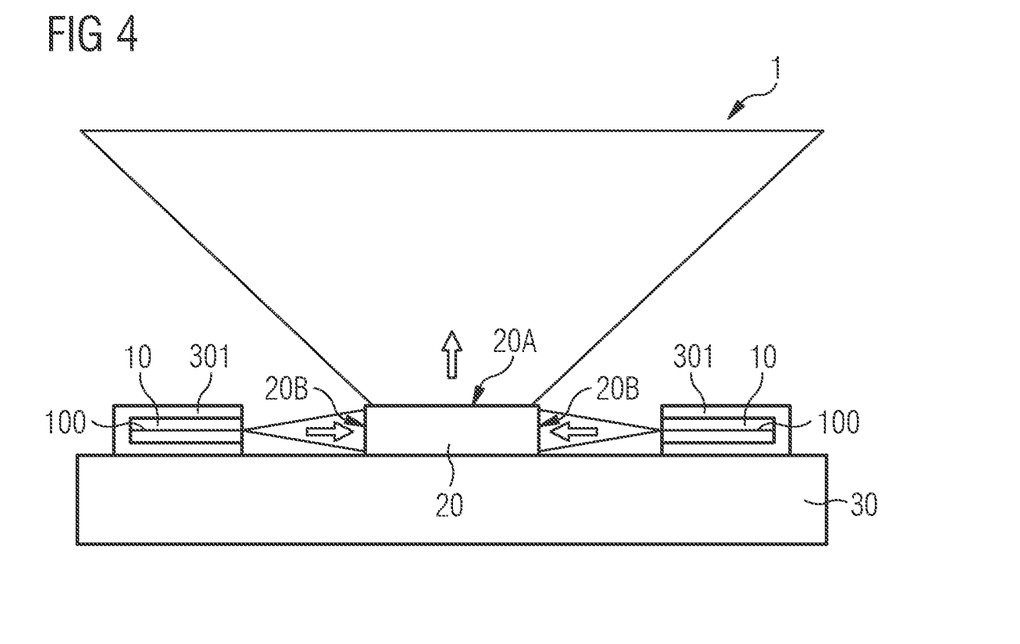

FIG. 4 shows a schematic sectional view of an optoelectronic component 1 described herein according to a third exemplary embodiment. Two optoelectronic semiconductor emitters 10 with auxiliary carriers 301 are arranged on a carrier 30. The semiconductor emitters 10 each include an active region 100 arranged to generate electromagnetic radiation. The radiation of the first wavelength range emitted from the semiconductor emitters 10 enters the wavelength conversion plate 20 through the side surface 20B. In the wavelength conversion plate 20, at least a part of the electromagnetic radiation of the first wavelength range is converted to an electromagnetic radiation of a second wavelength range different from the first wavelength range.

The radiation of the first wavelength range and the second wavelength range mix in the wavelength conversion plate 20 to form a mixed radiation. The wavelength conversion plate 20 has an outcoupling surface 20A through which the mixed radiation is coupled out from the wavelength conversion plate 20. In particular, the mixed radiation is composed of blue light and yellow light, and thus evokes a white color impression to an observer.

Figure 5:
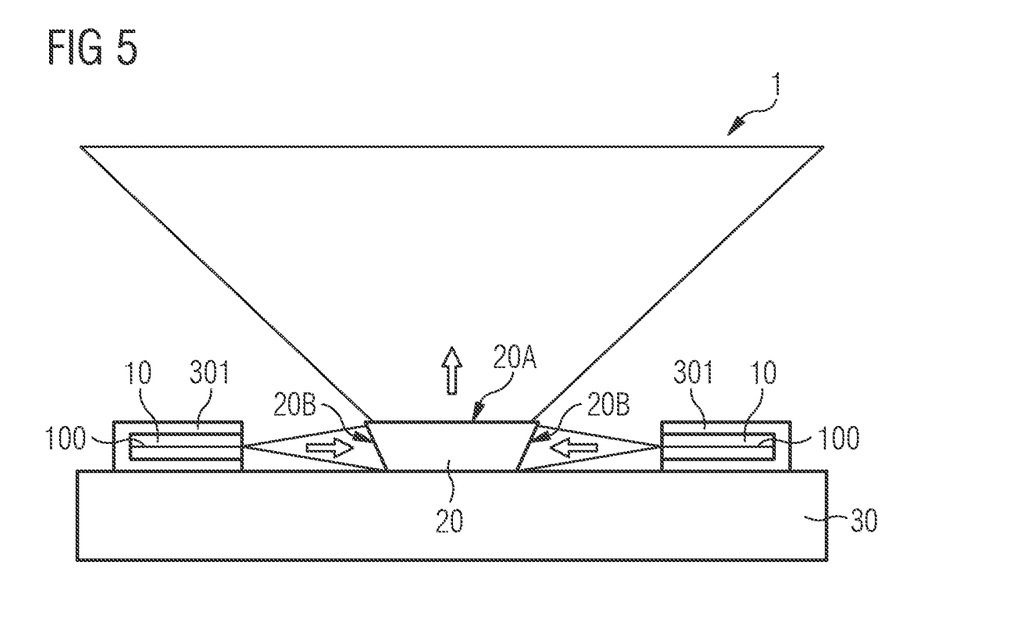

FIG. 5 shows a schematic sectional view of an optoelectronic component 1 described herein according to the first exemplary embodiment. The representation shown in FIG. 5 clearly shows a chamfer of the side surfaces 20B toward the carrier 30. The chamfer of the side surfaces 20B allows electromagnetic radiation from the semiconductor emitters 10 to be coupled into the wavelength conversion plate 20 at the Brewster angle. Advantageously, the inclination of the side surface 20B towards the carrier 30 prevents possible direct coupling out of electromagnetic radiation of the first wavelength range. Radiation of the first wavelength range, which exits from the semiconductor emitters 10 and is partially reflected by the side surface 20B, is thus only reflected in the direction of the carrier 30, where it is absorbed, for example.

Figure 6:
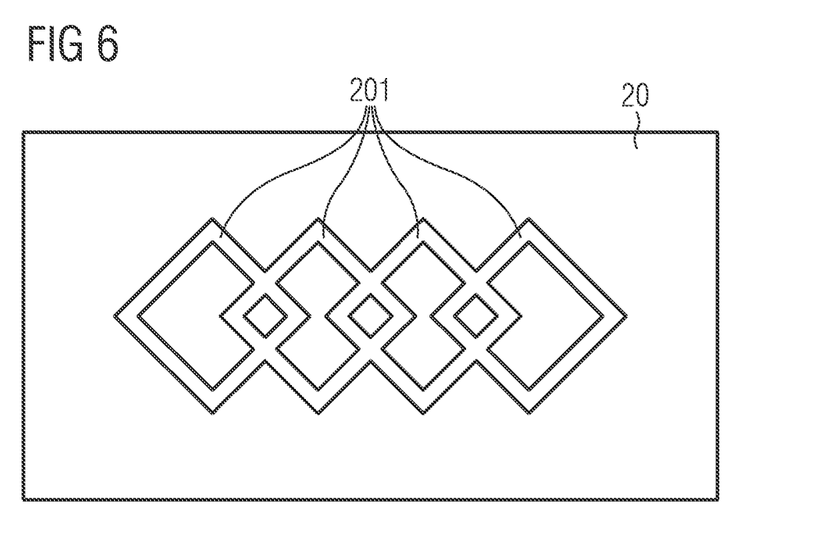

FIG. 6 shows a schematic top view of a wavelength conversion plate 20 described herein according to a first exemplary embodiment. The wavelength conversion plate 20 shown comprises a plurality of sub regions 201 which are designed to be absorbing or reflecting. The sub regions 201 are thus used, for example, for projecting a logo, in that these sub regions comprise a reduced or no emission of electromagnetic radiation. In particular, the sub regions 201 are arranged as coatings on the side of the wavelength conversion plate 20 facing away from the carrier 30. A reflective sub region 201 reflects electromagnetic radiation at least partially back into the wavelength conversion plate 20, allowing the radiation to be coupled out at another location.

Figure 7:
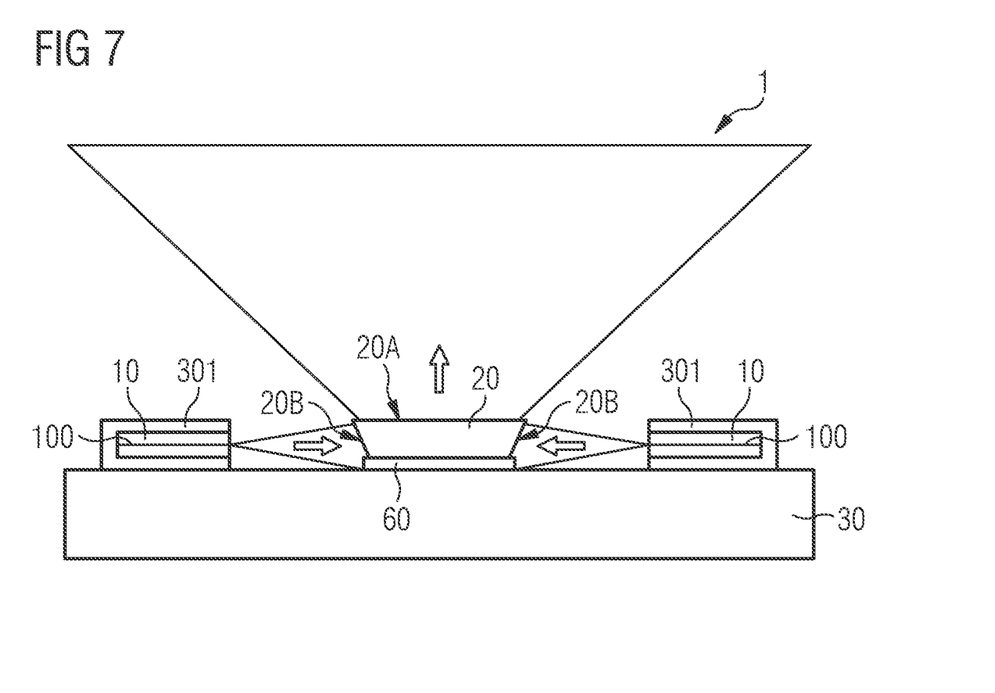

FIG. 7 shows a schematic sectional view of an optoelectronic component 1 described herein according to a fourth exemplary embodiment. The optoelectronic component 1 comprises a carrier 30 on which a plurality of semiconductor emitters 10 are mounted with the aid of auxiliary carriers 301. The semiconductor emitters 10 each comprise an active region for generating electromagnetic radiation of a first wavelength range. A wavelength conversion plate 20 is mounted on the carrier 30, which is configured to at least partially convert electromagnetic radiation of the first wavelength range into electromagnetic radiation of a second wavelength range. Via the side surfaces 20B of the wavelength conversion plate 20, the semiconductor emitters 10 couple the electromagnetic radiation of the first wavelength range into the wavelength conversion plate 20. Consequently, a mixed radiation of electromagnetic radiation of the first wavelength range and the second wavelength range exits from the wavelength conversion plate 20.

The carrier 30 further includes a reflection-increasing coating 60 arranged between the carrier 30 and the wavelength conversion plate 20. The reflection-increasing coating 60 is formed, for example, with a metal or a titanium dioxide and is used to reflect the mixed radiation generated in the wavelength conversion plate 20. Advantageously, the reflection-increasing coating 60 increases the efficiency of the optoelectronic component 1.

Figure 8:
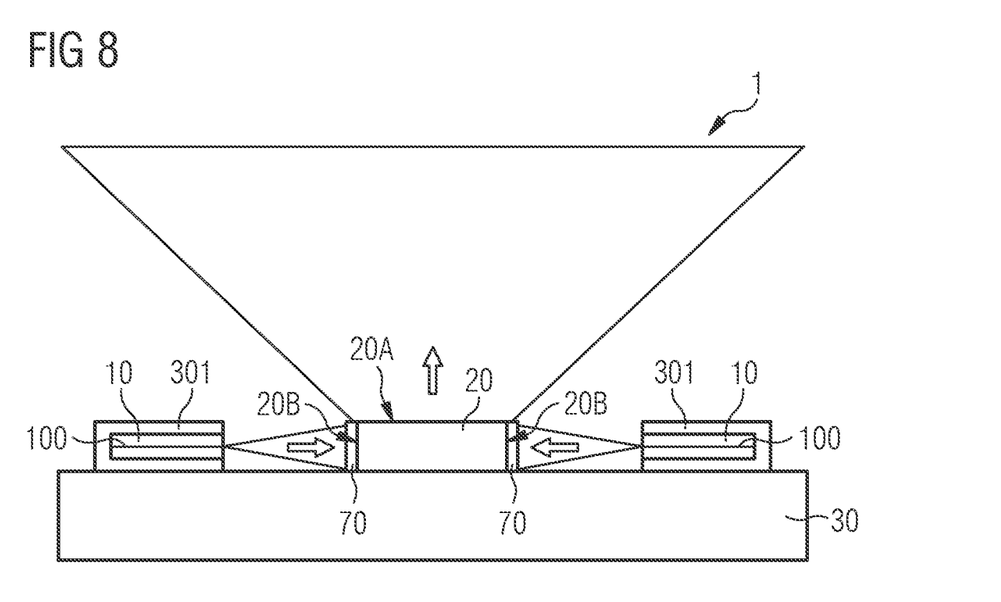

FIG. 8 shows a schematic sectional view of an optoelectronic component 1 described herein according to a fifth exemplary embodiment. The fifth exemplary embodiment is substantially identical to the third exemplary embodiment shown in FIG. 4. In addition, an optical coating 70 is arranged on the side surface 20B of the wavelength conversion plate 20. The optical coating 70 comprises an anti-reflective layer and/or a dichroic layer and advantageously increases the coupling efficiency of electromagnetic radiation into the wavelength conversion plate 20. For this purpose, the side surface 20B does not have to be oriented at a specific angle to the emission cone of the electromagnetic radiation. In particular, a dichroic layer is transmissive to the electromagnetic radiation from the semiconductor emitter 10 while being reflective to the electromagnetic radiation converted in the wavelength conversion plate 20.

The invention is not limited by the description based on the exemplary embodiments. Rather, the invention encompasses any new feature, as well as any combination of features, which particularly includes any combination of features in the patent claims, even if that feature or combination itself is not explicitly specified in the patent claims or exemplary embodiments.

The invention claimed is:

1. An optoelectronic component comprising,
at least one semiconductor emitter comprising an active region configured to emit electromagnetic radiation of a first wavelength range,
at least one wavelength conversion plate comprising an outcoupling surface and a side surface arranged laterally thereto and aligned transversely thereto, and
a carrier on which the semiconductor emitter and the wavelength conversion plate are arranged, wherein
the outcoupling surface is facing away from the carrier,
the semiconductor emitter is configured to irradiate the wavelength conversion plate with electromagnetic radiation at the side surface, and
the wavelength conversion plate is configured to emit a mixed radiation comprising at least a portion of radiation of the first wavelength range and a converted radiation of a second wavelength range from the outcoupling surface,
wherein the semiconductor emitter comprises an emission cone whose cross-section perpendicular to an axis of the emission cone comprises an elliptical shape, wherein the semiconductor emitter is arranged on the carrier such that the longer ellipse axis is aligned parallel to the main extension direction of the side surface, and
the wavelength conversion plate comprises a plurality of sub regions which are configured to be absorbing or reflecting.

2. The optoelectronic component according to claim 1, wherein the semiconductor emitter is a laser diode.

3. The optoelectronic component according to claim 1, in which the side surface is oriented at a Brewster angle to the axis of the emission cone.

4. The optoelectronic component according to claim 1, wherein an optical coating is applied to the side surface.

5. The optoelectronic component according to claim 1, in which a light guide is arranged between the semiconductor emitter and the wavelength conversion plate, which guides radiation from the semiconductor emitter onto the wavelength conversion plate.

6. The optoelectronic component according to claim 1, in which at least two semiconductor emitters are provided for irradiating the side surface.

7. The optoelectronic component according to claim 6, in which the emission cones of at least two semiconductor emitters at least partially overlap.

8. The optoelectronic component according to claim 1, in which the wavelength conversion plate comprises at least one absorbing or reflecting sub region for selectively influencing the emission behavior of the wavelength conversion plate.

9. The optoelectronic component according to claim 1, wherein the wavelength conversion plate comprises conversion particles and scattering particles.

10. The optoelectronic component according to claim 9, wherein a desired intensity distribution of the mixed radiation over the outcoupling surface of the wavelength conversion plate is adjusted by means of a variation of a scattering effect in the wavelength conversion plate.

11. The optoelectronic component according to claim 9, wherein a desired intensity and/or color distribution of the mixed radiation over the outcoupling surface of the wavelength conversion plate is adjusted by means of a variation of a conversion effect in the wavelength conversion plate.

12. The optoelectronic component according to claim 1, wherein the wavelength conversion plate comprises a thickness of 3 μm inclusive to 500 μm inclusive.

13. The optoelectronic component according to claim 1, wherein the first wavelength range of the semiconductor emitter comprises a region from 380 nm inclusive to 500 nm inclusive.

14. The optoelectronic component according to claim 1, wherein the carrier is formed with one of the following materials: aluminum nitride, a metal and/or a silicon carbide.

15. The optoelectronic component according to claim 1, wherein a reflection-increasing coating is arranged between the carrier and the wavelength conversion plate for radiation to be emitted from the wavelength conversion plate.

16. The optoelectronic component according to claim 1, wherein the wavelength conversion plate comprises a thickness of 70 μm inclusive to 150 μm inclusive.

17. The optoelectronic component according to claim 1, wherein the first wavelength range of the semiconductor emitter comprises a region from 440 nm inclusive to 460 nm inclusive.

* * * * *